United States Patent [19]
Ghoshal

[11] Patent Number: 5,159,291
[45] Date of Patent: Oct. 27, 1992

[54] DIGITALLY CONTROLLED TIMING RECOVERY LOOP WITH LOW INTRINSIC JITTER AND HIGH JITTER TOLERANCE

[75] Inventor: Sajol C. Ghoshal, Orangevale, Calif.

[73] Assignee: Level One Communications, Inc., Folsom, Calif.

[21] Appl. No.: 756,609

[22] Filed: Sep. 9, 1991

Related U.S. Application Data

[63] Continuation-in-part of Ser. No. 612,569, Nov. 13, 1990, Pat. No. 5,068,628.

[51] Int. Cl.⁵ .................... H03L 7/089; H03L 7/091; H03L 7/093
[52] U.S. Cl. .................................. 331/1 A; 331/11; 331/25
[58] Field of Search ................. 331/1 A, 10, 11, 17, 331/25

[56] References Cited

U.S. PATENT DOCUMENTS 4,855,683 8/1989 Troudet et al. ................. 331/1 A X
4,975,660 12/1990 Svenson ........................... 331/1 A

*Primary Examiner*—Siegfried H. Grimm
*Attorney, Agent, or Firm*—Merchant, Gould, Smith, Edell, Welter & Schmidt

[57] ABSTRACT

A timing recovery loop comprising a multi-point sampling phase comparator 10, a data independent smoothing filter 12, a command sequencer 14, a digitally controlled ring oscillator with clock phase selection 16, a clock divider 18, a sampling clock generation control 20, a bandwidth controlling filter 166, a sequential prioritizer 168, a quarter bit detector 170, and a filter 172. The timing recovery loop has a triple loop structure for improved jitter tolerance and bandwidth control. All three loops share the common components of the ring oscillator 16, the clock divider 18, the sampling clock generation 20, the sampling phase comparator 10, and the command sequencer 14. The remaining components are used among one or more of the loops.

19 Claims, 8 Drawing Sheets

| PENDING COMMANDS | 3 BIT LOADABLE COUNTER INPUTS 12 11 10 |   |   |
|---|---|---|---|
| NONE | 0 | 0 | 0 |
| 7 | 0 | 0 | 1 |
| 6 | 0 | 1 | 0 |
| 5 | 0 | 1 | 1 |
| 4 | 1 | 0 | 0 |
| 3 | 1 | 0 | 1 |
| 2 | 1 | 1 | 0 |
| 1 | 1 | 1 | 1 |

FIG. 7

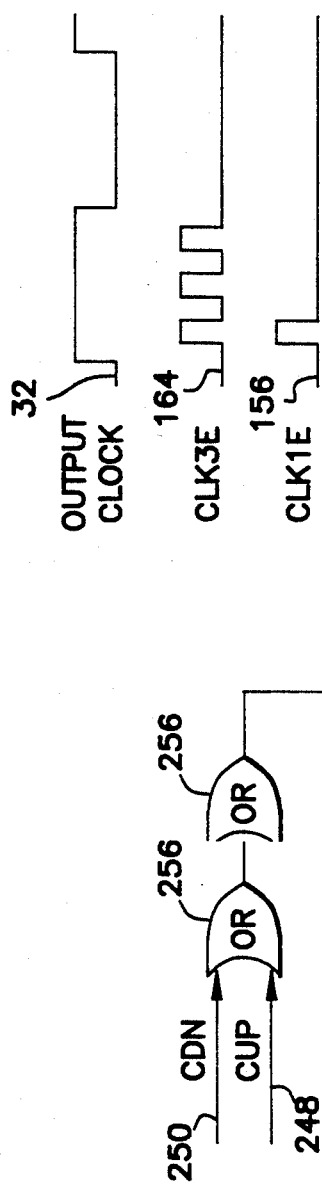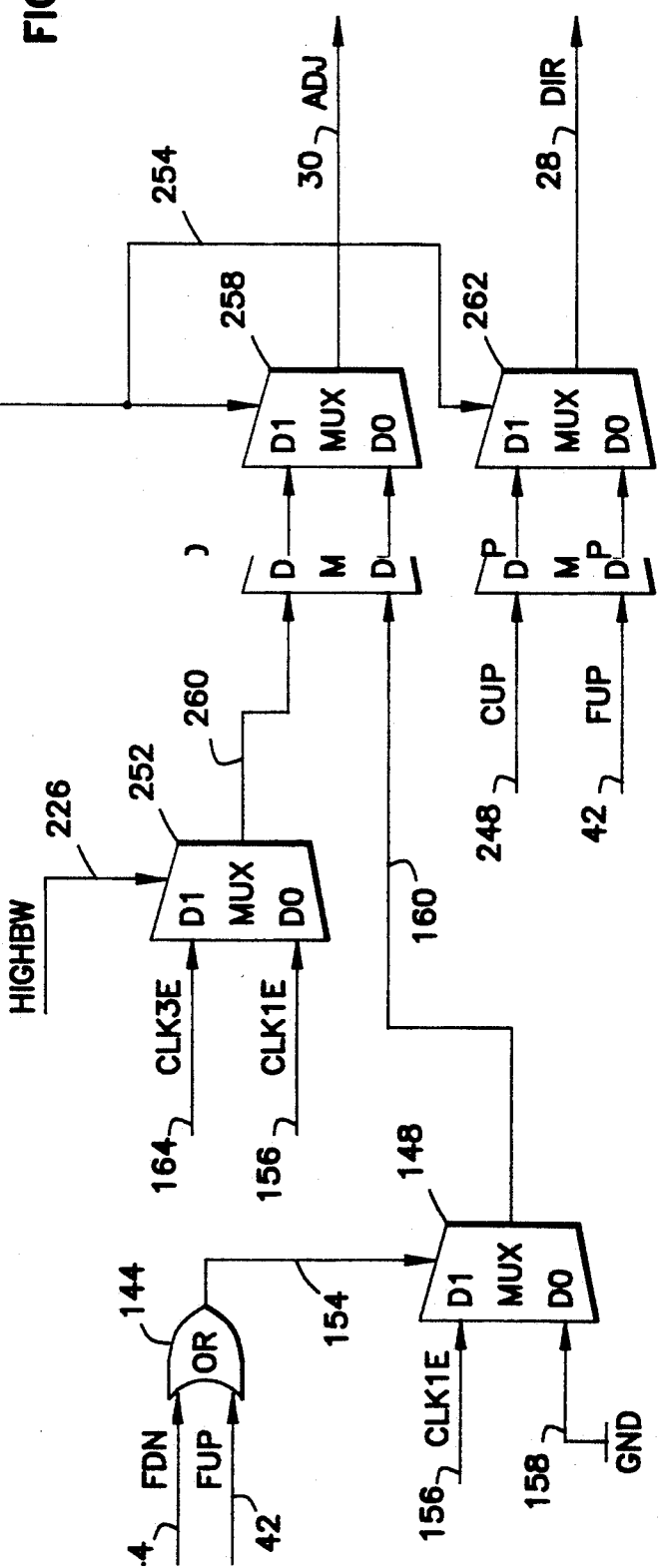
FIG. 8A
FIG. 8B

DIGITALLY CONTROLLED TIMING RECOVERY LOOP WITH LOW INTRINSIC JITTER AND HIGH JITTER TOLERANCE

BACKGROUND OF THE INVENTION

1. Cross-Reference To Related Application

This application is a continuation-in-part of application Ser. No. 07/612,569 filed Nov. 13, 1990, by Sajol Ghoshal entitled "A DIGITALLY CONTROLLED TIMING RECOVERY LOOP," (now U.S. Pat. No. 4,068,628) which application is incorporated by reference herein.

2. Field of the Invention

This invention relates in general to timing recovery loops, and in particular, to a digitally controlled timing recovery loop for long range repeaters transmitting data at 1.544 Mbps or 2.048 Mbps.

3. Description of Related Art

Long range repeaters are typically used in the transmission of data at 1.544 Mbps or 2.048 Mbps. Often, a large number of repeaters are connected in tandem, so it is extremely important to minimize accumulated intrinsic jitter from each repeater. In order to minimize the accumulated jitter at the end of a chain of repeaters, the intrinsic jitter of each individual repeater must be very low.

Most long range repeaters have adaptive equalizers in their front ends to reconstruct the received signal from the transmission channel. Since the transmission medium has limited bandwidth, the signal appears distorted at the end of the channel. Distortion on a pulse causes the pulse to reduce in amplitude and spread out in time. Since one pulse smears into another, it becomes difficult to extract timing information.

The equalizer adjusts the gain and frequency response of its filter to negate the effect of the channel and bring the pulse stream back to a distortion-free state. Since the equalizer cannot remove 100% of the distortions in a pulse, residual distortion, called Inter-Symbol Interference (ISI), is left on the equalized pulse. This ISI causes the pulse to shift, and distorts both edges thereof somewhat symmetrically about the peak of the pulse.

The distortion of the pulse is a function of the type of data bits transmitted before a current bit. Typically, marks are transmitted as pulses and spaces are transmitted as no pulses. Thus, if a previous bit was a mark and its ISI affects the current bit, the current bit will move by the ISI induced by the previous bit. However, if the previous bit was a space, then the current bit is not affected. This results in data dependent, ISI-induced, intrinsic jitter.

ISI affects both edges of a pulse, by moving it in time and reducing its amplitude. If only one edge of the pulse is used to gain timing information from the data stream, then a timing recovery loop in the repeater would pass ISI-induced jitter through. This would make the intrinsic jitter too high. The major part of ISI distortion occurs in pulse shape distortion rather than in pulse position distortion.

In addition to minimizing intrinsic jitter, long range repeaters are also required to tolerate a relatively large amount of incoming jitter. This requires that the timing recovery loop in the repeater adapt its clock signal quickly to follow the jittered data without losing the data. This produces a design constraint inconsistent with the requirement of low intrinsic jitter.

SUMMARY OF THE INVENTION

To overcome limitations in the prior art, and to overcome other limitations that will become apparent upon reading and understanding the present specification, the present invention discloses a timing recovery loop which tolerates a relatively large amount of incoming jitter and minimizes data dependent, ISI-induced, intrinsic jitter. The timing recovery loop is comprised of an oscillator with clock phase selection for generating a clock signal, wherein the oscillator accepts an adjust signal and a direction signal to control the degree and direction of phase shift in the clock signal, thereby causing it to speed-up and slow-down as required. Means are provided for sampling and comparing pulse amplitudes in the input signal so that a plurality of speed-up and slow-down signals can be generated in response thereto indicating an amount and direction of pulse position distortion in the input signal. A triple loop structure, controlled by a selection signal to operate in either a jitter tolerance mode or a bandwidth controlling mode, translates the speed-up and slow-down signals into the adjust and direction signals, and transmits the adjust and direction signals to the oscillator to eliminate jitter due to pulse position distortion in the input signal.

BRIEF DESCRIPTION OF THE DRAWINGS

Referring now to the drawings in which like reference numbers corresponding elements throughout:

FIG. 7 is a table indicating the values stored in the counters for 1 to 7 pending commands; and FIG. 8A is a block diagram that describes the components of the command sequencer; and FIG. 8B is a timing diagram illustrating the output from the command sequencer.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Timing Recovery Loop

Figure 1:
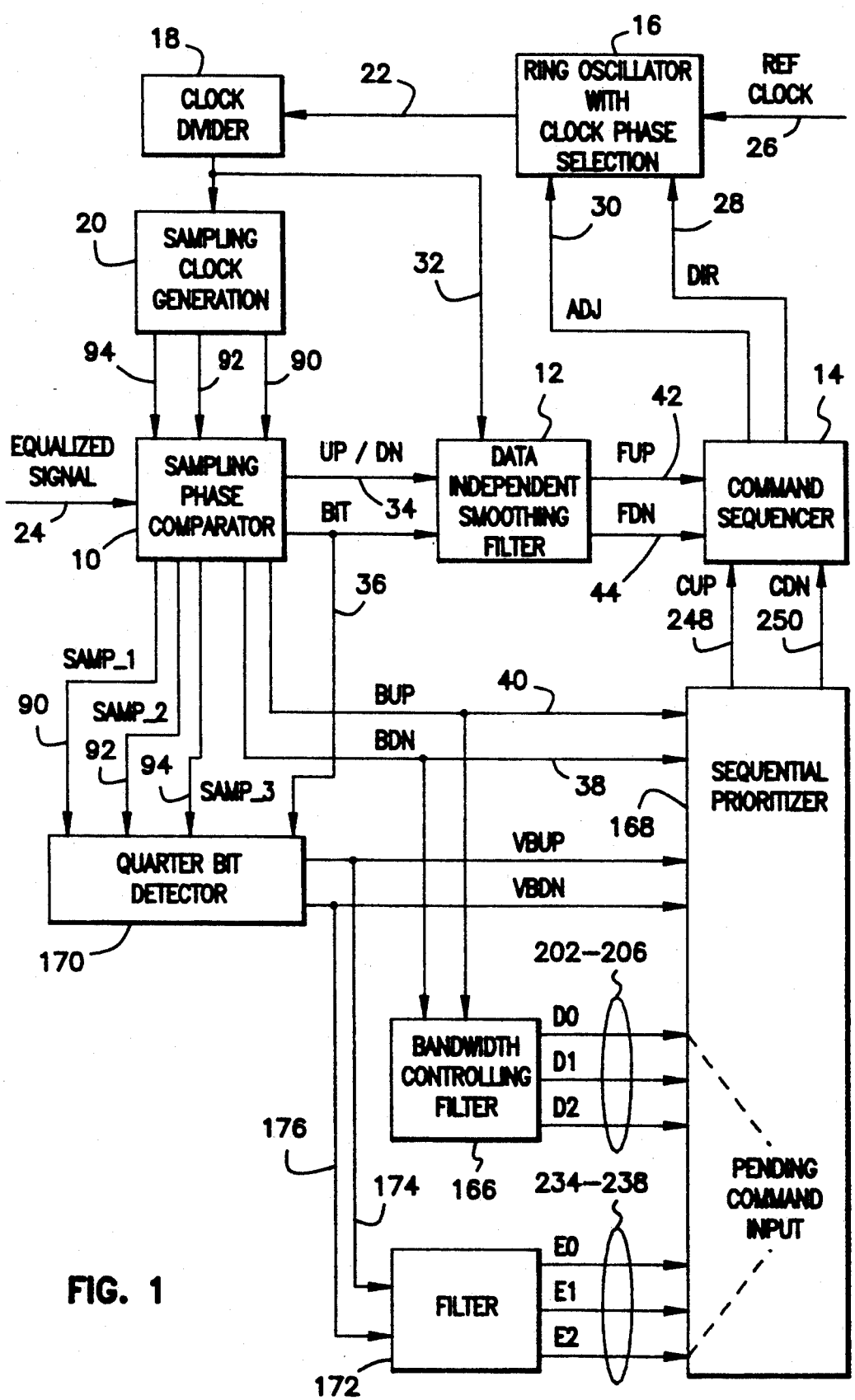
FIG. 1 is a block diagram illustrating the timing recovery loop of the present invention.

FIG. 1 is a block diagram illustrating the timing recovery loop of the present invention. The bandwidth of the timing recovery loop can be controlled while maintaining the same jitter tolerance and intrinsic jitter as the timing recovery loop described in the parent application. Further, the bandwidth of the timing recovery loop can be increased to thus develop a much higher jitter tolerance while maintaining the same intrinsic jitter as the timing recovery loop described in the parent application.

The present invention includes the components described in the parent application, including a multi-point sampling phase comparator 10, a data independent smoothing filter 12, a command sequencer 14, a digitally controlled ring oscillator with clock phase selection 16, a clock divider 18, a sampling clock generation control 20. In addition, the present invention further comprises a bandwidth controlling filter 166, a sequential prioritizer 168, a quarter bit detector 170, and a filter 172.

Using these components, the present invention provides triple loop timing recovery with improved jitter tolerance and bandwidth control. All three loops of the present invention share the common components of the ring oscillator 16, the clock divider 18, the sampling clock generation 20, the sampling phase comparator 10, and the command sequencer 14. The remaining components are used among one or more of the loops.

The first loop is comprised of the common components described above, and also includes the data independent smoothing filter 12 which counts UP/DN signals 34 and, BIT signals 36 received from the sampling phase comparator 10. If more than thirty-two UP signals 34 are received, then the filter 12 transmits a FUP signal 42 to the command sequencer 14. If more than thirty-two DN signals 34 are received, then the filter 12 transmits a FDN signal 44 to the command sequencer 14. Each time the FUP signal 42 or FDN signal 44 is executed by the command sequencer 14, the ring oscillator 16 makes an adjustment in the period of the output clock signal 32. In addition, the filter 12 observes a sliding window of prior UP/DN signals 34, so that each UP/DN signal 34 contributes a plurality of times to the determination of whether to adjust the output clock signal 32.

The second loop is comprised of the common components described above, and also includes the bandwidth controlling filter 166 and the sequential prioritizer 168. The bandwidth controlling filter 166 is externally controlled to determine how the BUP signals 40 or the BDN signals 38 are used by the sequential prioritizer 168. If a jitter tolerance mode is selected, then the bandwidth controlling filter 166 is bypassed and 2 "pending commands" are transmitted to the sequential prioritizer 168. If a bandwidth controlling mode is selected, then the bandwidth controlling filter 166 counts the number of sequential BUP signals 40 or BDN signals 38 generated by the sampling phase comparator 10 and translates the count into 1, 2, or 3 pending commands for transmittal to the sequential prioritizer 168. The sequential prioritizer 168 stores the pending commands on a priority basis, and then transmits them sequentially to the command sequencer 14. Each time a pending command is executed by the command sequencer 14, the ring oscillator 16 makes an adjustment in the period of the output clock signal 32. In a jitter tolerance mode of operation, the command sequencer 14 pulses an ADJ signal 30 a plurality of times to indicate the degree of phase shift required in an output clock signal 32. The plurality of consecutive pulses of the ADJ signal 30 can pull the oscillator 16 further in time, thereby providing a higher jitter tolerance.

The third loop is comprised of the common components described above, and also includes the quarter bit detector 170, the filter 172, and the sequential prioritizer 168. The quarter bit detector 170 identifies those occasions when the phase error exceeds a quarter of a bit period, and in response transmits a VBUP signal 174 or a VBDN signal 176 to the sequential prioritizer 168. The filter 172 is externally controlled and determines how the VBUP signals 174 or the VBDN signals 176 are used by the sequential prioritizer 168. If a bandwidth controlling mode is selected, then the VBUP signals 174 and the VBDN signals 176 are ignored by the sequential prioritizer 168. If a jitter tolerance mode is selected, then each VBUP signal 174 or VBDN signal 176 is translated into 6 pending commands and transmitted to the sequential prioritizer 168. The sequential prioritizer 168 stores the pending commands on a priority basis, and then transmits them sequentially to the command sequencer 14. Each time a pending command is executed by the command sequencer 14, the ring oscillator 16 makes an adjustment in the period of the output clock signal 32. In a jitter tolerance mode of operation, the command sequencer 14 pulses an ADJ signal 30 a plurality of times to indicate the degree of phase shift required in an output clock signal 32. The plurality of consecutive pulses of the ADJ signal 30 can pull the oscillator 16 further in time, thereby providing a higher jitter tolerance.

The following paragraphs further describe the components of the timing recovery loop. Those skilled in the art will readily recognize that the operation and interaction of the three loops can be understood from the following description of each of the components.

Ring Oscillator

The digitally controlled ring oscillator 16 generates an oscillator clock signal 22 that provides accurate and robust timing control for the present invention. The structure and operation of the oscillator 16 is described in more detail in the parent application Ser. No. 07/612,569, which application is incorporated by reference herein.

The frequency of the oscillator clock signal 22 is preferably much higher than an input signal, i.e., the equalized signal 24, and is locked to a reference clock signal 26. The reference clock signal 26 is preferably approximately the same frequency as the equalized signal 24 and supplied by an external source, e.g., another oscillator.

The oscillator 16 accepts two inputs, the DIR signal 28 and the ADJ signal 30, to control the direction and degree of phase shift of an oscillator clock signal 22, thereby causing it to speed-up or slow-down. The clock divider 18 is used to divide down the oscillator clock signal 22 to provide an output clock signal 32. Data recovered from the equalized signal 24 is applied to the output clock signal 32 for re-transmission in a manner well known in the art.

Multi-Point Sampling Phase Comparator

The multi-point sampling phase comparator 10 samples and compares the amplitude of a pulse in the equalized signal 24 at a plurality of points, preferably at the peak of the pulse and a quarter period on either side of the peak. The structure and operation of the multi-point sampling phase comparator 10 is described in more detail in the parent application Ser. No. 07/612,569, which application is incorporated by reference herein.

The sampling phase comparator 10 is driven by sampling clock signals 90, 92, and 94 to store the sampled amplitudes from the equalized signal 24, i.e., the SAMP-1 signal 90 samples a quarter of a period before the peak, the SAMP-2 signal 92 samples at the peak, and the SAMP-3 signal 94 samples a quarter of a period after the peak. The sampling clock signals 90, 92, and 94 are described in more detail in the parent application Ser. No. 07/612,569, which application is incorporated by reference herein. The sampling clock generation circuit 20 is not described further herein, because those skilled in the art will recognize that it only requires clock signals at least four times the frequency of the equalized signal 24 and the necessary logic to select the required pulses thereof.

The sampling phase comparator 10 generates four output signals, i.e., an UP/DN signal 34, a BIT signal 36, a BDN signal 38, and a BUP signal 40. The UP/DN signal 34 indicates whether the output clock signal 32 should be sped-up or slowed-down to eliminate jitter due to pulse position distortion or frequency offset on the equalized signal 24. The BIT signal 36 indicates whether a positive or negative mark, i.e., pulse, has been received on the equalized signal 24. The BDN signal 38 indicates that a "Big slow-Down" is required of the output clock signal 32 because a mark received on the equalized signal 24 deviates from, i.e., leads, the timing of a previously received mark by more than ⅛th of a period. The BUP signal 40 indicates that a "Big speed-UP" is required of the output clock signal 32 because a mark received on the equalized signal 24 deviates from, i.e., trails, the timing of a previously received mark by more than ⅛th of a period. The UP/DN signal 34 and the BIT signal 36 are transmitted to the data independent smoothing filter 12; the BIT signal 36 is also transmitted to the quarter bit detector 170; the BDN signal 38 and the BUP signal 40 are transmitted to the sequential prioritizer 168 and bandwidth controlling filter 166; and the sampling clock signals 90, 92, and 94 are transmitted through to the quarter bit detector 170.

Data Independent Smoothing Filter

The data independent smoothing filter 12 controls the frequency lock between the equalized signal 24 and the output clock signal 32 to provide low intrinsic jitter. It also filters some of the Inter-Symbol Interference (ISI) induced jitter and reduces its effect. The structure and operation of the data independent smoothing filter 12 is described in more detail in the parent application Ser. No. 07/612,569, which application is incorporated by reference herein.

The data independent smoothing filter 12 is clocked by the output clock signal 32 and accepts as input the UP/DN signal 34 and the BIT signal 36. If more than thirty-two UP signals 34 are received, then the filter 12 transmits the FUP signal 42 to the command sequencer 14. If more than thirty-two DN signals 34 are received, then the filter 12 transmits the FDN signal 44 to the command sequencer 14. Each time a FUP signal 42 or FDN signal 44 is executed by the command sequencer 14, the ring oscillator 16 makes an adjustment in the period of the output clock signal 32, which in the preferred embodiment amounts to a 1/96th change in the period of the output clock signal 32. Thus, if a stream of all marks are received on the equalized signal 24, then the output clock signal 32 is adjusted by 1/96th of its period for every 32 bits. This provides a pull range for the oscillator 16 with respect to the output clock signal 32 of 1/(96*32) of its period, or 10e6/(96*32) parts per million (ppm), or 325 ppm. However, when the mark density drops, as when receiving random data, to as low as 12.5% (1 mark in every 8 bits), then the pull range of the oscillator 16 with respect to the output clock signal 32 drops to (325/8=40 ppm), which is unacceptable. This occurs because adjustments to the output clock signal 32 are made only when marks are received on the equalized signal 24.

In order to solve the pull range problem during low mark density and to make the pull range relatively independent of mark density, the filter 12 observes a sliding window of 8 bits, and each speed-up command (i.e., UP signal 34) and slow-down command (i.e., DN signal 34), contributes approximately 8 times to the determination of whether to adjust the output clock signal 32. Hence, in data streams with a low density of marks, e.g., 1 mark in 8 bits, the pull range of the oscillator 16 is enhanced by 8 times, thereby bringing it back to 325 ppm. In an all marks pattern, the pull range stays at 325 ppm, because the oscillator 16 is adjusted only every 32 bits. Thus, the averaging sliding window of 8 bits makes the pull range of the oscillator 16 independent of mark density, without compromising the bandwidth or intrinsic jitter of the timing recovery loop. Further, in order to prevent locking inadvertently on repetitive 8-bit fixed patterns, the averaging sliding window may be reduced to 7 bits. This reduces the low pulse density pull range of the oscillator 16 to (7/8*325=285 ppm), which is still adequate.

Bandwidth Controlling Filter

In order to control the bandwidth of the present invention, the bandwidth controlling filter 166 is introduced between the sampling phase comparator 10 and the command sequencer 14 to intercept the outputs from the sampling phase comparator 10, i.e., the BUP signal 40 and the BDN signal 38, and translate them into pending commands for transmittal to the sequential prioritizer 168 and subsequent execution by the command sequencer 14.

Figure 2:
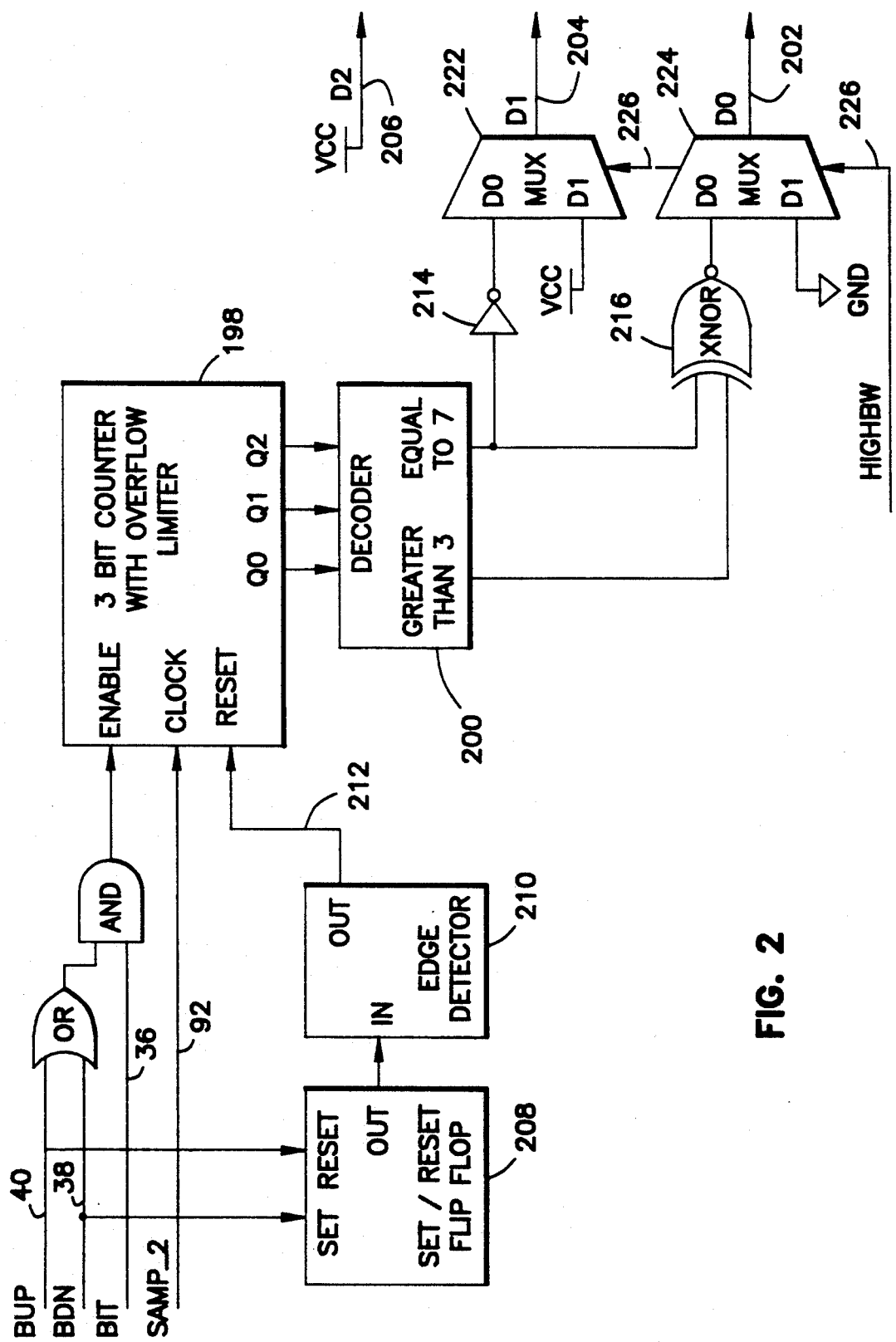
FIG. 2 is a block diagram that describes the components of the bandwidth controlling filter.

FIG. 2 is a block diagram that describes the components of the bandwidth controlling filter 166. The number of sequential BUP signals 40 or BDN signals 38 are counted in a 3-bit counter 198. The counter 198 is enabled whenever a BUP signal 40 or BDN signal 38 is received, along with a mark as indicated by the BIT signal 36. The counter 198 is clocked by the SAMP-2 signal 92 so that it increments whenever it is enabled. The counter 198 also has an overflow limiter (not shown) which prevents its from incrementing beyond $111_2$ (i.e., $7_{10}$), and therefore, the counter 198 stays at $111_2$ until reset.

The BUP signal 40 is used to reset a flip-flop 208 and the BDN signal 38 is used to set the flip-flop 208. The output of the flip-flop 208 changes state whenever a change occurs from a high BUP signal 40 to a high BDN signal 38, or vice versa. The output of the flip-flop 208 is connected to the input of an edge detector 210 which produces an output signal 212. The output signal 212 is forced high for one bit cycle every time the input of the edge detector 210 transitions, which occurs whenever the output of the flip-flop 208 changes state. The output signal 212 from the edge detector 210 is transmitted to the reset input of the 3-bit counter 198. Thus, every time there is a change from a high BUP signal 40 to a high BDN signal 38, or vice versa, the counter 198 is reset by output signal 212.

A decoder 200 distinguishes counter 198 values greater than 3 and equal to 7 or greater to determine how many pending commands should be transmitted to the sequential prioritizer 168. If the counter 198 value is less than or equal to 3, then 1 pending command is transmitted to the sequential prioritizer 168 via the output signals D0 202, D1 204, and D2 206. If the counter 198 value is greater than 3 and less than 7, then 2 pending commands are transmitted to the sequential prioritizer 168 via the output signals D0 202, D1 204, and D2 206. If the counter 198 value is equal to 7, then 3 pending commands are transmitted to the sequential prioritizer 168 via the output signals D0 202, D1 204, and D2 206. The inverter 214 and XNOR gate 216 decode the outputs of the decoder 200 to indicate 1, 2 or 3 pending commands.

The D0 signal 202 and the D1 signal 204 are either the outputs of XNOR gate 216 and inverter 214, respectively, or fixed values; the D2 signal 206 is always held high. The selection of the D0 signal 202 and the D1 signal 204 are controlled by a HIGHBW signal 226 via multiplexors 222 and 224. The HIGHBW signal 226 is an external signal, selectable by the systems designer, which indicates that the timing recovery loop requires higher bandwidth.

For operation in a large jitter tolerance mode, the HIGHBW signal 226 is high, thus bypassing the bandwidth controlling filter 166 and selecting the fixed values as the D0 signal 202, the D1 signal 204, and the D2 signal 206, i.e., D2-D0 = $110_2$, which indicates 2 pending commands are transmitted to the sequential prioritizer 168 (see FIG. 7).

For operation in the bandwidth controlling mode, the HIGHBW signal 226 is low, thus selecting the outputs of the XNOR gate 216 and inverter 214 as the D0 signal 202 and the D1 signal 204, respectively, with the D2 signal 206 held high. For each of the three different states of the decoder 200 output, the following indicates the values of D2-D0:

(1) a counter 198 value less than or equal to 3, i.e., D2-D0 = $111_2$ which indicates that 1 pending command is transmitted to the sequential prioritizer 168 (see FIG. 7);

(2) a counter 198 value greater than 3 but not equal to 7, i.e., D2-D0 = $110_2$ which indicates that 2 pending commands are transmitted to the sequential prioritizer 168 (see FIG. 7); or (3) a counter 198 value greater than 3 and equal to 7, i.e., D2-D0 = $101_2$ which indicates that 3 pending commands are transmitted to the sequential prioritizer 168 (see FIG. 7).

Quarter Bit Detector

A quarter bit detector 170 is added as an extension to the sampling phase comparator 24 for those situations where the bandwidth of the timing recovery loop must be increased. The quarter bit detector 170 determines when the phase error between the equalized signal 24 and the output clock signal 32 exceeds a quarter of a bit period, i.e., when a mark received on the equalized signal 24 deviates from the timing of a previously received mark by more than $\frac{1}{4}$th of a period, and in response transmits the VBUP 174 signal or VBDN 176 signal to the sequential prioritizer 168.

Figure 3:
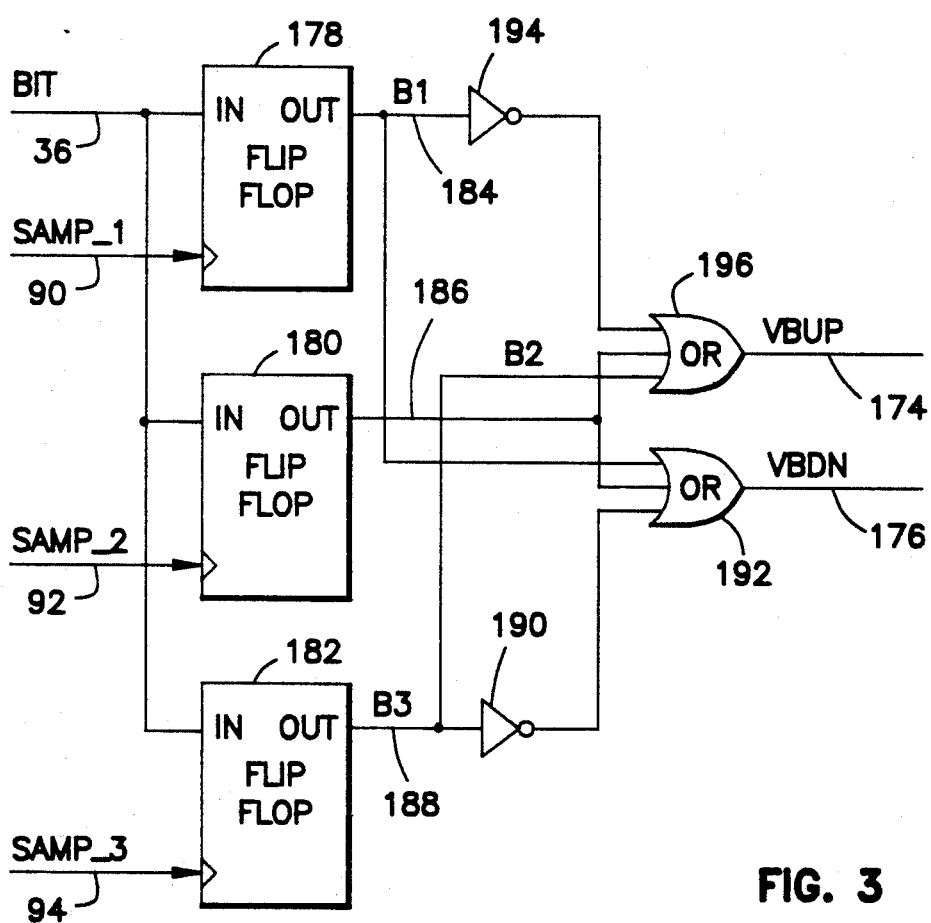
FIG. 3 is a block diagram that describes the components of the quarter bit detector.
Figure 4:
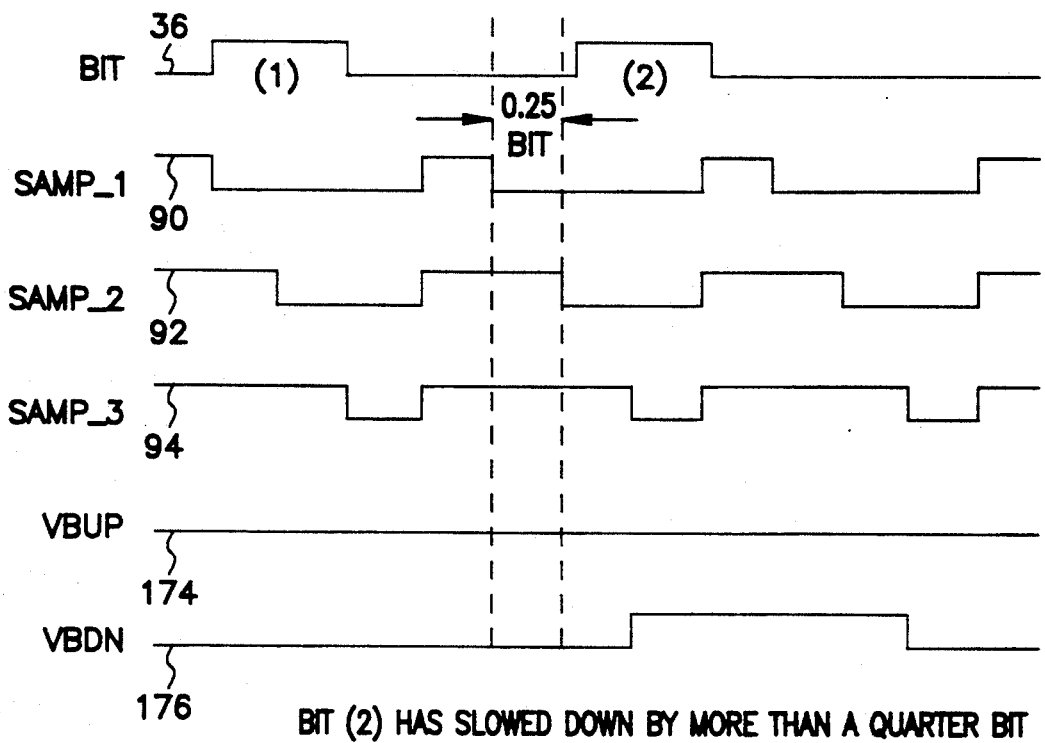
FIG. 4 is a timing diagram illustrating the pattern of bits that have been sped-up or slowed-down by more than a quarter of a bit.
Figure 4:
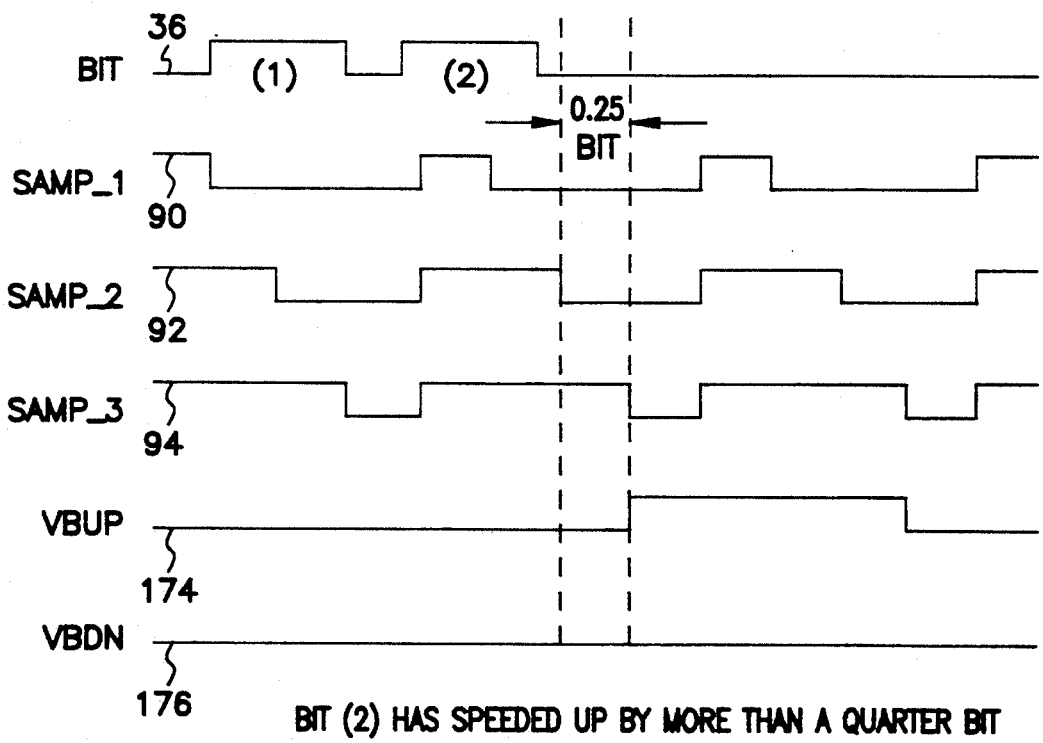

FIG. 3 is a block diagram that describes the components of the quarter bit detector 170. The quarter bit detector 170 samples the BIT signal 36 output from the sampling phase comparator 10 at three points spaced at quarter bit intervals as indicated by the timing diagram of FIG. 4. Under normal locked conditions, the falling edge of the SAMP-1 signal 90 is a quarter bit prior to the center of the mark in the BIT signal 36, the SAMP-2 signal 92 is at the center of the mark in the BIT signal 36, and the SAMP-3 signal 94 is a quarter bit after the center of the mark in the BIT signal 36. Thus, the mark in the BIT signal 36 is sampled in three flip-flops 180-184 whose outputs, the B1 signal 184, the B2 signal 186, and the B3 signal 188, correspond to the BIT signal 36 sampled by the SAMP-1 signal 90, the SAMP-2 signal 92, and the SAMP-3 signal 94. If a space is the next bit transmitted on the BIT signal 36, then the B1 signal 184, the B2 signal 186, and the B3 signal 188 will all be low. If a mark is the next bit transmitted on the BIT signal 36, and the mark has no jitter on its edges, then the B2 signal 186 will be high, along with either or both the B1 signal 184 and the B3 signal 188. If a mark is the next bit transmitted on the BIT signal 36, and the mark has jitter on its edges, then the B1 signal 184, the B2 signal 186, and the B3 signal 188 will have a different set of values.

For example, if the next mark in the BIT signal 36 has slowed-down by more than a quarter of a bit period, then the B1 signal 184 and the B2 signal 186 will be low and the B3 signal 188 will be high. The decoded output created by the inverter 190 on the B3 signal 188 and the OR gate 192 will produce a high VBDN signal 176, i.e., a "Very Big slow-DowN" command.

On the other hand, if the next mark in the BIT signal 36 has sped-up by more than a quarter of a bit period, then the B3 signal 188 and the B2 signal 186 will be low and the B1 signal 184 will be high. The decoded output created by the inverter 194 on the B1 signal 184 and the OR gate 196 will produce a high VBUP signal 174, i.e., a "Very Big speed-UP" command.

Filter

Figure 5:
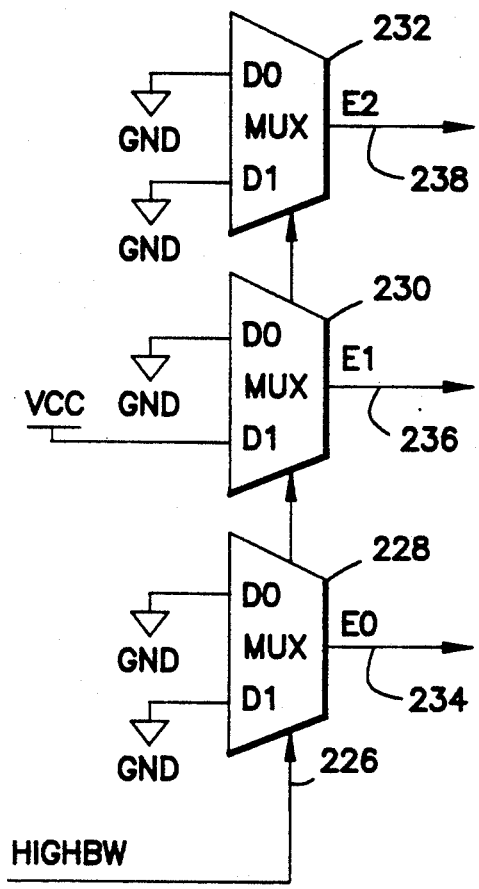
FIG. 5 is a block diagram that describes the components of the filter.

FIG. 5 is a block diagram that describes the components of the filter 172. The filter 172 is controlled by the HIGHBW signal 226, and determines how the VBUP signals 174 and the VBDN signals 176 are used by the sequential prioritizer 168. The multiplexors 228-232 are controlled by the HIGHBW signal 226 to select the desired values for the E0 signal 234, the E1 signal 236, and the E2 signal 238. The E0 signal 234, the E1 signal 236, and the E2 signal 238 are transmitted to the sequential prioritizer 168.

If the HIGHBW signal 226 is low for operation in the bandwidth controlling mode, then E2-E0 = $000_2$ which indicates that no pending commands are to be transmitted to the sequential prioritizer 168 when the VBUP signal 174 or the VBDN signal 176 is received (see FIG. 7). If the HIGHBW signal 226 is high for operation in the large jitter tolerance mode, then E2-E0 = $010_2$ which indicates that 6 pending commands are to be transmitted to the sequential prioritizer 168 when the VBUP signal 174 or the VBDN signal 176 is received (see FIG. 7).

Sequential Prioritizer

The function of the sequential prioritizer 168 is twofold. Its first function is to store pending commands on a priority basis, and to transmit them sequentially, i.e., one at a time, to the command sequencer 14. The "priority basis" refers to the fact that the VBUP signals 174 and VBDN signals 176 will override any simultaneous BUP signals 40 and BDN signals 38 to determine which pending commands are stored by the sequential prioritizer 168. A pending command is identified as either a "speed-up pending command" if associated with the BUP signal 40 or the VBUP signal 174, or "slow-down pending command" if associated with the BDN signal 38 or the VBDN signal 176.

Figure 6:
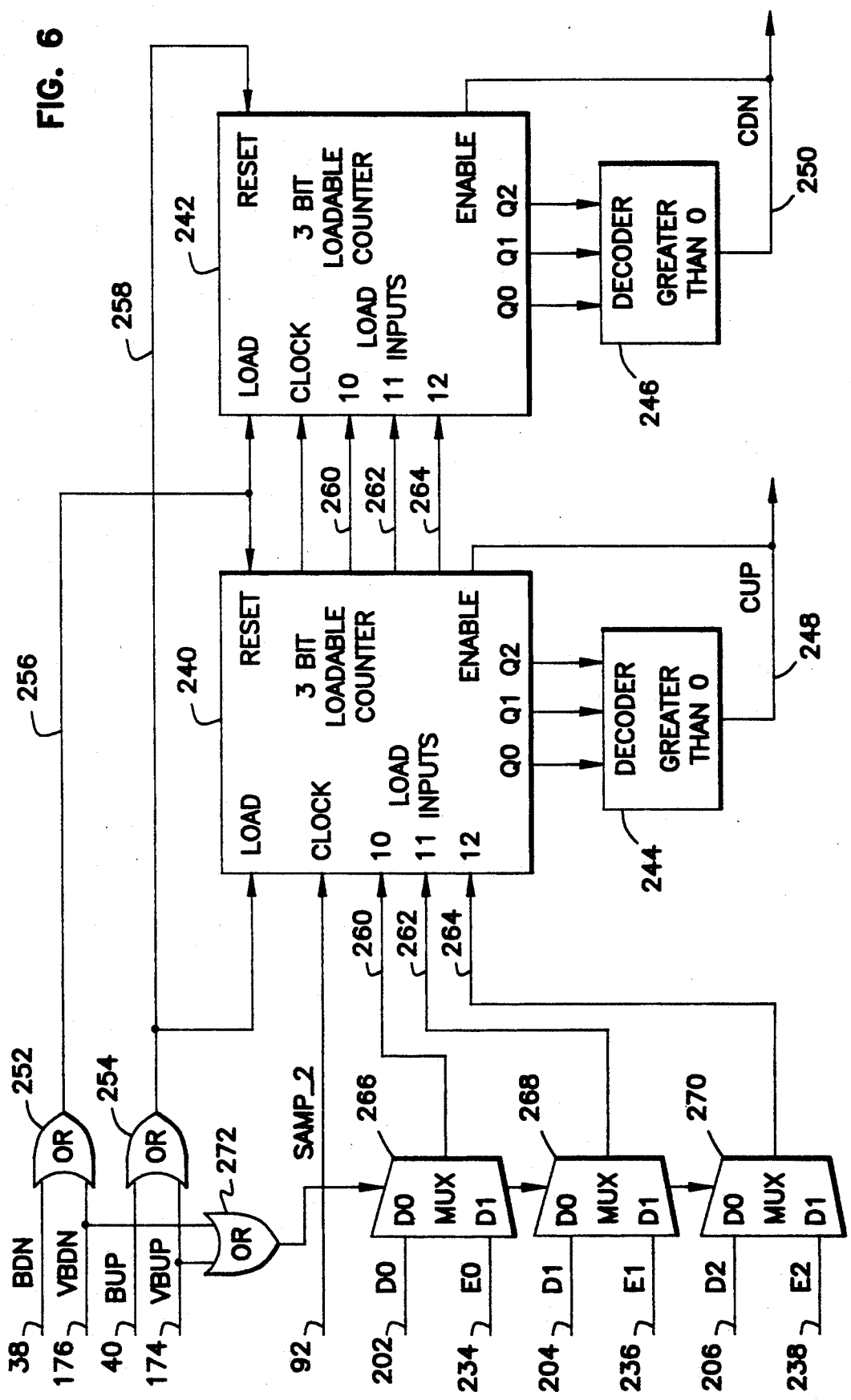
FIG. 6 is a block diagram that describes the components of the sequential prioritizer.

FIG. 6 is a block diagram that describes the components of the sequential prioritizer 168. The sequential prioritizer 168 consists of two 3-bit synchronously loadable counters 240 and 242. The values in the counters 240 and 242 represent the number of speed-up or slow-down pending commands, respectively, to be executed by the command sequencer 14. Each counter 240 or 242 increments whenever it contains a non-zero value; both counters 240 and 242 are clocked by the SAMP-2 signal 92; and each counter 240 or 242 is enabled by the output of the respective decoder 244 or 246.

Whenever the BDN signal 38 or the VBDN signal 176 goes high, the OR gate 252 produces load signal 256. The load signal 256 loads the slow-down counter 242 with the number of pending commands indicated by signals 260-264 and resets the speed-up counter 240. Whenever the BUP signal 40 or the VBUP signal 174 goes high, the OR gate 254 produces load signal 258. The load signal 258 loads the speed-up counter 240 with the number of pending commands indicated by signals 260-264 and resets the slow-down counter 242.

The signals 260-264 are outputs from the multiplexors 266-270. The OR gate 272 provides the signal for enabling the selection by the multiplexors 266-270. If either the VBUP signal 174 or the VBDN signal 176 is high, then inputs E0-E2 234-238 from the filter 172 are selected by the multiplexors 266-270 to indicate the number of pending commands to be stored. If the VBUP signal 174 and the VBDN signal 176 are both low, then inputs D0-D2 202-206 from the bandwidth controlling filter 166 are selected by the multiplexors 266-270 to indicate the number of pending commands to be stored.

In operation, the sequential prioritizer 168 will store 6 pending commands when the HIGHBW signal 226 is high, and either the VBUP signal 174 or the VBDN signal 176 is high. The sequential prioritizer 168 will store 0 pending commands when the HIGHBW signal 226 is low, and either the VBUP signal 174 or the VBDN signal 176 is high. The sequential prioritizer 168 will store 1, 2, or 3 pending commands, depending on the output of the bandwidth controlling filter 166, when the HIGHBW signal 226 is low, both the VBUP signal 174 and the VBDN signal 176 are low, and either the BUP signal 40 or the BDN signal 38 is high. The sequential prioritizer 168 will store 2 pending commands when the HIGHBW signal 226 is high, both the VBUP signal 174 and the VBDN signal 176 are low, and either the BUP signal 40 or the BDN signal 38 is high.

When there are no pending commands, counter 240 or 242 stores a binary value of $000_2$. Each time a pending command value is received, the counter 240 or 242 is loaded with a 2's complement value of the number of pending commands. FIG. 7 is a table indicating the values stored in the counters 240 or 242 for 1 to 7 pending commands. For example, if 1 pending command is to be loaded in the counter 240 or 242, a value of $111_2$ is loaded.

When the value stored in each counter 240 or 242 is non-zero, then the counter 240 or 242 increments at every period of the SAMP-2 signal 92 until it rolls over to $000_2$, which indicates that there are no more pending commands. Each counter 240 or 242 is disabled and prevented from incrementing whenever it holds a value of $000_2$, via the output of the decoder 244 or 246, respectively.

The decoder 244 decodes the output of the counter 240, producing the CUP signal 248. The CUP signal 248 is high whenever the output from counter 240 is not equal to zero. The decoder 246 decodes the outputs from counter 242, producing the CDN signal 250. The CDN signal 250 is high whenever the output from counter 242 is not equal to zero.

Command Sequencer

In the present invention, the command sequencer 14 accepts the FUP signal 42 and FDN signals 44 from the data independent smoothing filter 12, and the CUP signal 248 and CDN signal 250 from the sequential prioritizer 168. In any speed-up operation (indicated by the CUP signal 248 or the FUP signal 42), the command sequencer 14 forces the DIR signal 28 high. In any slow-down operation (indicated by the CDN signal 250 or the FDN signal 44), the command sequencer 14 forces the DIR signal 28 low. The command sequencer 14 also pulses the ADJ signal 30 either once or three times to indicate the amount of phase shift required for the output clock signal 32. The three consecutive pulses of the ADJ signal 30 can pull the oscillator 16 further in time, thereby providing a higher jitter tolerance for the high jitter tolerance mode of operation.

FIG. 8A is a block diagram that describes the components of the command sequencer 14 in the present invention. FIG. 8B is a timing diagram that illustrates the operation of the command sequencer 14 in the present invention.

The command sequencer 14 is prioritized to allow the CUP signals 248 and CDN signals 250 to supersede the FUP signals 42 and FDN signals 44. If the FUP signal 42 or the FDN signal 44 is high, then the output 154 of OR gate 144 enables multiplexor 148 to select a CLK1E signal 156; otherwise multiplexor 148 selects voltage ground 158. If the HIGHBW signal 226 is high, then multiplexor 252 selects the CLK3E signal 164; otherwise the multiplexor 252 selects the CLK1E signal 156. If the CUP signal 248 or the CDN signal 250 is high, then the output 254 of OR gate 256 enables multiplexor 258 to select the output signal 260 of multiplexor 252; otherwise multiplexor 258 selects the output 160 of multiplexor 148. The output of multiplexor 258 provides an ADJ signal 30.

The output of multiplexor 262 provides a DIR signal 28. If the CUP signal 248 or the CDN signal 250 is high, then the output 254 of OR gate 256 enables multiplexor 262 to select the CUP signal 248; otherwise multiplexor 262 selects the FUP signal 42.

As shown in the timing diagram of FIG. 8B, for each bit period of the output clock signal 32, the CLK1E signal 156 is pulsed one time and the CLK3E signal 164 is pulsed three times. The three consecutive pulses of the CLK3E signal 164 can pull the oscillator 16 further in time, thereby providing a higher jitter tolerance. If the CUP signal 248 or CDN signal 250 is high and the HIGHBW signal 226 is high (indicating operation in the large jitter tolerance mode), then three consecutive pulses are transmitted on the ADJ signal 30 during a single period of the output clock signal 32; otherwise, if the HIGHBW signal 226 is low (indicating operation in the bandwidth controlling mode), then one pulse is transmitted on the ADJ signal 30 during a single period of the output clock signal 32. Whenever the CUP signal 248 and CDN signal 250 are both low, and either the FUP signal 42 or the FDN signal 44 are high, then one pulse is transmitted on the ADJ signal 30 during a single period of the output clock signal 32; otherwise, no pulses are transmitted on the ADJ signal 30. Whenever either the CUP signal 248 or the CDN signal 250 is high, then the direction indicated by the DIR signal 28 will be "up" if the CUP signal 248 is high; otherwise the direction indicated by the DIR signal 28 will be "down." Whenever both the CUP signal 248 and the CDN signal 250 are low, and either the FUP signal 42 or the FDN is high, then the direction indicated by the DIR signal 28 will be "up" if the FUP signal 42 is high; otherwise the direction indicated by the DIR signal 28 will be "down."

Conclusion

In summary, a timing recovery loop has been described which tolerates a relatively large amount of incoming jitter and minimizes data dependent, ISI-induced, intrinsic jitter. The timing recovery loop is comprised of an oscillator 16 with clock phase selection for generating a clock signal, wherein the oscillator accepts an adjust signal and a direction signal to control the degree and direction of phase shift in the clock signal, thereby causing it to speed-up and slow-down as required. A sampling phase comparator 10 and quarter bit detector 170 are provided for sampling and comparing pulse amplitudes in the input signal so that a plurality of speed-up and slow-down signals can be generated in response thereto indicating an amount and direction of pulse position distortion in the input signal. A triple loop structure, controlled by a selection signal to operate in either a jitter tolerance mode or a bandwidth controlling mode, translates the speed-up and slow-down signals into the adjust and direction signals, and transmits the adjust and direction signals to the oscillator 16 to eliminate jitter due to pulse position distortion in the input signal.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A timing recovery loop for an input signal, comprising:
   (a) an oscillator with clock phase selection for generating an output signal, wherein the oscillator accepts an adjust signal and a direction signal to control the degree and direction of phase shift in the output signal, thereby causing it to speed-up and slow-down as required;
   (b) means for sampling and comparing a pulse amplitude in the input signal at a plurality of points along the pulse and for generating one or more of a plurality of speed-up and slow-down signals in response thereto, each of the speed-up and slow-down signals indicating a different amount of pulse position distortion in the input signal relative to the output signal; and
   (c) loop means, controlled by a selection signal to operate in either a jitter tolerance mode or a bandwidth controlling mode, for translating the speed-up and slow-down signals into the adjust and direction signals required to lock the output signal to the input signal, and for transmitting the adjust and direction signals to the oscillator to eliminate jitter due to pulse position distortion from the input signal, wherein the selection signal controls the bandwidth of the loop means.

2. The timing recovery loop as set forth in claim 1 above, wherein the means for sampling and comparing further comprises:
   means for generating an UP signal which indicates whether the output signal should be sped-up to eliminate jitter due to pulse position distortion or frequency offset on the input signal;
   means for generating a DN signal which indicates whether the output signal should be slowed-down to eliminate jitter due to pulse position distortion or frequency offset on the input signal;
   means for generating a BDN signal which indicates that a "Big slow-DowN" is required of the output signal because a mark received on the input signal leads the timing of a previously received mark by more than a first predetermined amount of a period;
   means for generating a BUP signal which indicates that a "Big speed-UP" is required of the output signal because a mark received on the input signal trails the timing of a previously received mark by more than the first predetermined amount of the period;
   means for generating a VBDN signal which indicates that a "Very Big slow-DowN" is required of the output signal because a mark received on the input signal leads the timing of a previously received mark by more than a second predetermined amount of the period, wherein the second predetermined amount of the period is greater than the first predetermined amount of the period; and
   means for generating a VBUP signal which indicates that a "Very Big speed-UP" is required of the output signal because a mark received on the input signal trails the timing of a previously received mark by more than the second predetermined amount of the period.

3. The timing recovery loop as set forth in claim 2 above, wherein the loop means further comprises:
   a first loop for translating the UP and DN signals into the adjust and direction signals;
   a second loop, controlled by the selection signal, for translating the BUP and BDN signals into the adjust and direction signals according to the selection signal; and
   a third loop, controlled by the selection signal, for translating the VBUP and VBDN signals into the adjust and direction signals according to the selection signal.

4. The timing recovery loop as set forth in claim 3 above, wherein the first loop comprises means for counting consecutive UP signals and consecutive DN signals, wherein the adjust and direction signals are generated when a predetermined number of consecutive UP signals are received and there are no simultaneous VBUP, VBDN, BUP, and BDN signals, and wherein the adjust and direction signals are generated when a predetermined number of consecutive DN signals are received and there are no simultaneous VBUP, VBDN, BUP, and BDN signals.

5. The timing recovery as set forth in claim 4 above, wherein the first loop further comprises means for observing a sliding window of prior UP and DN signals, so that each UP and DN signal contributes a plurality of times to the determination of whether to generate the adjust and direction signals.

6. The timing recovery loop as set forth in claim 3 above, wherein the second loop comprises means for generating a fixed number of adjust and direction signals in response to the BUP and BDN signals when the selection signal indicates a jitter tolerance mode and there are no simultaneous VBUP and VBDN signals.

7. The timing recovery loop as set forth in claim 3 above, wherein the second loop comprises means for counting the number of consecutive BUP or BDN signals and means for generating a plurality of adjust and direction signals based on the count when the selection signal indicates a bandwidth controlling mode and there are no simultaneous VBUP and VBDN signals.

8. The timing recovery loop as set forth in claim 3 above, wherein the third loop comprises means for ignoring the VBUP and VBDN signals when the selection signal indicates a bandwidth controlling mode is selected, and means for generating a plurality of adjust and direction signals for each VBUP and VBDN signal when the selection signal indicates a jitter tolerance mode is selected.

9. The timing recovery loop as set forth in claim 1 above, wherein the loop means further comprises means for pulsing the adjust signal one or more times to indicate the degree of phase shift required in the output signal.

10. A timing recovery loop for an input signal, comprising:
 (a) an oscillator with clock phase selection for generating an output signal, wherein the oscillator accepts an adjust signal and a direction signal to control an amount and direction of phase shift in the output signal, thereby causing it to speed-up and slow-down as required;
 (b) means for sampling and comparing a pulse amplitude in the input signal at a plurality of points along the pulse, and for generating one or more of a plurality of speed-up and slow-down signals in response thereto indicating the amount and direction of phase shift required to lock the output signal to the input signal, wherein the speed-up and slow-down signals comprise:
  (1) first signals for indicating that a phase shift in a particular direction is required to lock the output signal to the input signal,
  (2) second signals for indicating that a first predetermined amount of phase shift in a particular direction is required to lock the output signal to the input signal because a mark received on the input signal deviates from the timing of a previously received mark by more than a first predetermined amount of a period, and
  (3) third signals for indicating that a second predetermined amount of phase shift in a particular direction is required to lock the output signal to the input signal because a mark received on the input signal deviates from the timing of a previously received mark by more than a second predetermined amount of the period, wherein the second predetermined amount of the period is greater than the first predetermined amount of the period and the second predetermined amount of phase shift is greater than the first predetermined amount of phase shift;
 (c) a first loop for counting first signals generated by the means for sampling and comparing, and for generating the adjust and direction signals when a predetermined consecutive number of the first signals in the same direction are counted;
 (d) a second loop, controlled by a selection signal, for generating a fixed number of adjust and direction signals when a second signal is generated by the means for sampling and comparing and the selection signal indicates a jitter tolerance mode, and for generating a varying number of adjust and direction signals based on a count of consecutive second signals in the same direction generated by the means for sampling and comparing when the selection signal indicates a bandwidth controlling mode; and
 (e) a third loop, controlled by a selection signal, for ignoring a third signal generated by the means for sampling and comparing when the selection signal indicates a bandwidth controlling mode, and for generating a plurality of adjust and direction signals when a third signal is generated by the means for sampling and comparing and the selection signal indicates a jitter tolerance mode.

11. The timing recovery loop as set forth in claim 10 above, further comprising means for ignoring adjust and direction signals generated by the first loop when adjust and direction signals are simultaneously generated by the second or third loops.

12. The timing recovery loop as set forth in claim 10 above, further comprising means for ignoring the adjust and direction signals generated by the second loop when adjust and direction signals are simultaneously generated by the third loop.

13. The timing recovery loop as set forth in claim 10 above, wherein the means for sampling and comparing comprises a sampling phase comparator and a quarter bit detector.

14. The timing recovery loop as set forth in claim 10 above, wherein the first loop further comprises means for observing a sliding window of prior first signals, so that each first signal contributes a plurality of times to the determination of whether to generate the adjust and direction signals.

15. The timing recovery loop as set forth in claim 10 above, wherein the second loop further comprises means for pulsing the adjust signal a plurality of times to indicate the degree of phase shift required in the output signal when the selection signal indicates a jitter tolerance mode.

16. The timing recovery loop as set forth in claim 10 above, wherein the third loop further comprises means for pulsing the adjust signal a plurality of times to indicate the degree of phase shift required in the output signal when the selection signal indicates a jitter tolerance mode.

17. A timing recovery loop, comprising:
 (a) oscillator means for generating an output signal;
 (b) phase detection means, connected to the oscillator means, for determining a phase error between the output signal and an input signal;
 (c) first loop means, connected to the phase detection means and the oscillator means, for counting occurrences of the phase error in one direction, and for adjusting the direction and degree of phase shift of the output signal in response thereto;

(d) second loop means, connected to the phase detection means and the oscillator means, for adjusting the direction and degree of phase shift of the output signal in response to the phase error when the phase error exceeds a first predetermined amount, wherein the second loop means overrides the first loop means when adjusting the direction and degree of phase shift of the output signal; and (e) third loop means, connected to the phase detection means and the oscillator means, for adjusting the direction and degree of phase shift of the output signal in response to the phase error when the phase error exceeds a second predetermined amount, wherein the second predetermined amount is greater than the first predetermined amount, and wherein the third loop means overrides the first and second loop means when adjusting the direction and degree of phase shift of the output signal.

18. The timing recovery loop as set forth in claim 17 above, wherein the second loop means further comprises means for pulsing the adjust signal a plurality of times to indicate the degree of phase shift required in the output signal when the selection signal indicates a jitter tolerance mode.

19. The timing recovery loop as set forth in claim 17 above, wherein the third loop means further comprises means for pulsing the adjust signal a plurality of times to indicate the degree of phase shift required in the output signal when the selection signal indicates a jitter tolerance mode.

* * * * *

UNITED STATES PATENT AND TRADEMARK OFFICE
CERTIFICATE OF CORRECTION

PATENT NO. : 5,159,291

DATED : October 27, 1992

INVENTOR(S) : Sajol C. Ghoshal

It is certified that error appears in the above-identified patent and that said Letters Patent is hereby corrected as shown below:

Column 1, line 12, "4,068,628" should read --5,068,628--.

Signed and Sealed this

Twelfth Day of October, 1993

Attest:

BRUCE LEHMAN

*Attesting Officer*     *Commissioner of Patents and Trademarks*